United States Patent [19]

Rodder

[11] Patent Number: 4,877,755
[45] Date of Patent: Oct. 31, 1989

[54] METHOD OF FORMING SILICIDES HAVING DIFFERENT THICKNESSES

[75] Inventor: Mark S. Rodder, Dallas, Tex.

[73] Assignee: Texas Instruments Incorporated, Dallas, Tex.

[21] Appl. No.: 200,394

[22] Filed: May 31, 1988

[51] Int. Cl.⁴ .................................. H01L 21/283
[52] U.S. Cl. .................................. 437/200; 437/41; 437/192; 437/913; 148/DIG. 19; 148/DIG. 147; 357/71
[58] Field of Search ................. 437/201, 200, 41, 192, 437/203, 913; 148/DIG. 147, DIG. 19; 357/71

[56] References Cited

U.S. PATENT DOCUMENTS

| | | | |
|---|---|---|---|
| 4,445,266 | 5/1984 | Mai et al. | 437/56 |
| 4,587,718 | 5/1986 | Haken et al. | 437/200 |
| 4,740,484 | 4/1988 | Norström et al. | 437/200 |
| 4,755,478 | 7/1988 | Abernathey et al. | 437/41 |
| 4,821,085 | 4/1989 | Haken et al. | 357/67 |

OTHER PUBLICATIONS

Wolf et al., Silicon Processing, vol. 1-Process Technology, Lattice Press, 1984, pp. 384-405.
Murarka, "Self-Aligned Silicides or Metals for Very Large Scale Integrated Circuit Applications," J. Vac. Sci. Technol. B., vol. 4, No. 6, Nov./Dec. 1986, pp. 1325-1331.

Primary Examiner—Brian E. Hearn
Assistant Examiner—T. N. Quach
Attorney, Agent, or Firm—B. Peter Barndt; James T. Comfort; Melvin Sharp

[57] ABSTRACT

A MOS transistor (10) having a thicker silicide layer (50) over a gate (30) than a silicide layer (44) over source and drain regions (42) is disclosed. A process of the present invention forms a first silicide barrier (28) overlying the gate (30) when the gate is formed. Next, a first silicide formation process forms the first silicide layer (44) overlying source and drain regions (42). The silicide barrier layer (28) prevents silicide formation over the gate (30). The silicide barrier (28) is removed, and another silicide barrier (48) is formed over the first silicide layer (44). A second silicide formation process forms the second silicide layer (50) over the gate (30). The silicide barrier layer (48) prevents expansion of the first silicide layer (44).

18 Claims, 2 Drawing Sheets

METHOD OF FORMING SILICIDES HAVING DIFFERENT THICKNESSES

TECHNICAL FIELD OF THE INVENTION

The present invention relates generally to semiconductor devices. More specifically, the present invention relates to the fabrication of a MOS transistor in which a silicide formed over a gate may exhibit a different thickness than a silicide formed over source and drain regions.

BACKGROUND OF THE INVENTION

In the fabrication of MOS semiconductor devices, refractory metal silicides are often formed in source and drain (S/D) regions and in gate regions to lower resistance of these regions and to improve electrical contacts formed therewith. Conventionally, these silicides have been formed simultaneously in gate and S/D regions using a single silicide formation process. Consequently, such conventional gate silicides and S/D silicides are roughly the same thickness, and roughly the same silicide sheet resistivity results.

While it is desirable to have as thick a silicide and as low a sheet resistivity as possible in both gate and S/D regions, competing considerations may be more important for the S/D regions. One such consideration is junction depth in S/D regions. Shallower junction depths in S/D regions are more highly desired in MOS transistors to minimize unwanted short channel effects in the transistors and prevent punch-through. Thicker silicides in S/D regions require thicker S/D junction depths. Thus, a thinner S/D junction depth forces the formation of a thinner silicide. Consequently, MOS transistors benefit from the use of thicker silicides over gate regions when compared to silicides over formed S/D regions. If the thickness of such a conventionally formed one-step silicide is optimized for gate considerations, then it exhibits an inappropriate thickness in S/D regions; and, if it is optimized for S/D considerations, it exhibits an inappropriate thickness in gate regions.

Prior schemes for increasing gate silicide thickness relative to S/D silicide thickness have undesirable consequences. For example, in such schemes a gate stack having nitride or metal layers overlying a polycrystalline silicon layer is patterned and etched prior to silicide formation. Such schemes are undesirable because straight, vertically etched gate sidewalls are difficult to form from such stacks. In addition, such schemes may add thermal oxidation stages after formation of a gate oxide. Such additional thermal oxidation stages are undesirable because they tend to distort the geometry of the gate oxide underlying a gate region. Thus, a need exists for an improved method of fabricating different thickness silicides in gate and S/D regions of a semiconductor device.

SUMMARY OF THE INVENTION

Accordingly, it is an advantage of the present invention that an improved semiconductor device fabrication process is provided in which the thickness of a silicide overlying a gate region may differ from the thickness of a silicide overlying source and drain (S/D) regions.

Another advantage of the present invention is that the formation of a silicide overlying a gate region does not require the etching of nitride or metal layers in operations which define gate sidewalls.

Yet another advantage is that the present invention provides a technique for forming different thickness silicides over gate and S/D regions without requiring the use of additional thermal oxidation cycles.

The above and other advantages of the present invention are carried out in one form by a process in which a gate region is formed at a semiconducting surface area of a substrate. After formation of the gate, a first silicide layer is formed in the substrate along at least one side of the gate. Next, a silicide barrier layer, which prevents the first silicide layer from expanding in thickness, is formed overlying the first silicide layer. After the formation of the silicide barrier layer, a second silicide layer is formed on the gate region.

BRIEF DESCRIPTION OF THE DRAWINGS

A more complete understanding of the present invention may be derived by referring to the detailed description and claims when considered in connection with the FIGURES, wherein like reference numbers refer to similar items throughout the FIGURES, and:

DETAILED DESCRIPTION OF THE PREFERRED EMBODIMENT

FIGS. 1-9 illustrate a process used in forming a MOS field effect transistor 10. Whether transistor 10 represents an NMOS or PMOS transistor is not a critical feature in the present invention. The structure shown in FIGS. 1-9 may represent only a small portion of an integrated circuit which contains a multiplicity of similar and diverse devices. Moreover, FIGS. 1-9 illustrate a consistent, single, cross-sectional side view of MOS transistor 10 throughout the FIGURES.

Figure 1:
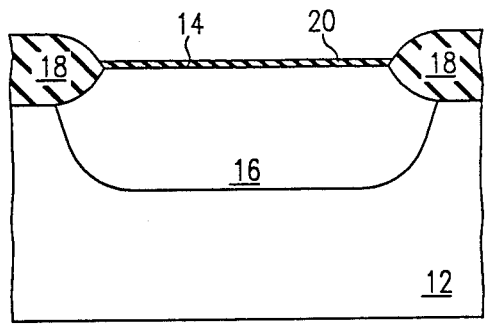
FIG. 1 shows a schematic, cross-sectional side view of the present invention at a first stage of fabrication.

FIG. 1 shows a schematic, cross-sectional side view of transistor 10 at a first stage of fabrication. At the first stage of fabrication depicted in FIG. 1, transistor 10 consists of a monocrystalline, silicon substrate 12, which may include an epitaxial layer (not shown) at a substrate surface 14 where transistor 10 is to be formed. In addition, transistor 10 includes a well region 16, which has been implanted with either an N or P type dopant depending upon the polarity of transistor 10. This dopant has been driven-in using conventional techniques Field oxide regions 18 reside on surface 14 of substrate 12 at the exterior portions of transistor 10. In the preferred embodiment, field oxide 18 is typically on the order of 5,000-8,000 angstroms thick. Moreover, a gate oxide 20 has been thermally grown at semiconductor surface 14 between field oxide regions 18. In the preferred embodiment, gate oxide layer 20 is typically on the order of 200 angstroms thick. The structure shown in FIG. 1 is a conventional structure in the fabrication of MOS transistors, may be utilized to form any one of many different types of MOS transistors, and is formed utilizing conventional semiconductor fabrication processes.

Figure 2:
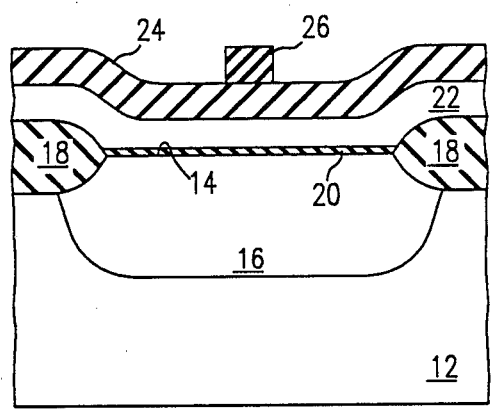
FIG. 2 shows a schematic, cross-sectional side view of the present invention at a second stage of fabrication.

FIG. 2 shows a schematic, cross-sectional side view of transistor 10 at a second stage of fabrication. In FIG. 2 the structure shown in FIG. 1 has been modified by the addition of a polycrystalline silicon (poly) layer 22, a TEOS oxide layer 24, and a photoresist mask layer 26. The present process deposits poly layer 22 using conventional LPCVD techniques to a thickness on the order of 4,500 angstroms in the preferred embodiment. Poly layer 22 resides over the entirety of transistor 10 on field oxide regions 18 and gate oxide 20. The present process uses conventional LPCVD techniques to deposit TEOS layer 24 over and in contact with poly layer 22. The factors which govern the thickness of TEOS layer 24 are discussed below in connection with FIG. 4. The process of the present invention applies photoresist mask 26 over the entirety of transistor 10 on TEOS layer 24. After the application of photoresist mask 26, mask 26 is developed so that a solid portion of mask 26 remains where a gate region is to be formed in transistor 10, as shown in FIG. 2.

Figure 3:
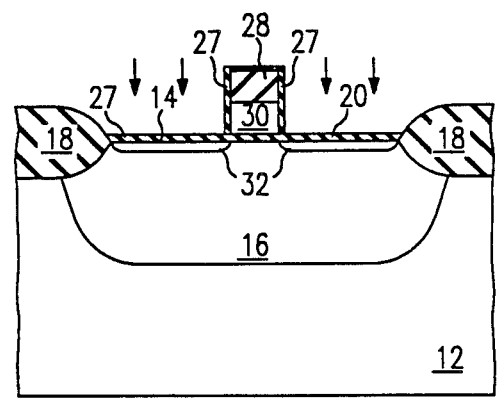
FIG. 3 shows a schematic, cross-sectional side view of the present invention at a third stage of fabrication.

FIG. 3 shows a schematic, cross-sectional side view of transistor 10 at a third stage of fabrication. The structure of FIG. 3 results from etching the structure shown in FIG. 2, removing photoresist mask 26, and performing an implantation step. Specifically, a conventional anisotropic etch is performed on transistor 10. This anisotropic etch first removes portions of TEOS layer 24 which do not reside underneath the solid portion of photoresist mask 26 (see FIG. 2). Next, in a separate task this anisotropic etch removes portions of poly layer 22 which do not reside underneath the solid portion of mask 26. This separate task uses a chemical etchant which is selective to oxides. Consequently, a majority of gate oxide layer 20 remains. Those skilled in the art will understand that such anisotropic etching steps may be routinely performed so that substantially straight vertical walls result on poly layer 22.

After completion of the anisotropic etch, photoresist mask 26 (see FIG. 2) is removed, and a TEOS layer 27 of around 300 angstroms in thickness is deposited to protect sidewalls of gate 30 from harmful effects of a subsequent implantation process. TEOS layer 27 is deposited over the entirety of transistor 10. The structure shown in FIG. 3 remains. The remaining portion of TEOS layer 24 along with TEOS layer 27 provide a silicide barrier 28, and the remaining portion of poly layer 22 forms a polycrystalline silicon gate 30. Next, as illustrated by arrows in FIG. 3, an implantation process introduces a dopant at surface 14 into substrate 12. This dopant may be either N type or P type dopant depending upon the polarity of transistor 10. Moreover, the concentration and energy levels of this dopant are consistent with the formation of a lightly doped drain, or reach through, portions 32 of source and drain regions (not shown in FIG. 3) for transistor 10.

Figure 4:
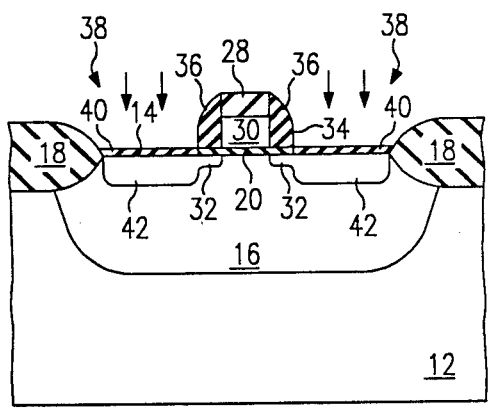
FIG. 4 shows a schematic, cross-sectional side view of the present invention at a fourth stage of fabrication.

FIG. 4 shows a schematic, cross-sectional side view of transistor 10 at a fourth stage of fabrication. The structure shown in FIG. 4 results from applying a TEOS oxide layer 34 over the entirety of transistor 10 as shown in FIG. 3, performing an etching process to create sidewall oxides 36 on gate 30, and performing a source/drain (S/D) implantation process. Specifically, the process of the present invention deposits TEOS layer 34 using conventional LPCVD techniques over the entirety of transistor 10. In the preferred embodiment, TEOS layer 34 is deposited to a thickness of around 1,800 angstroms. Next, an anisotropic etch process removes the TEOS layer 34 so that sidewall oxides 36 form on the sidewalls of gate 30. In the preferred embodiment, sidewall oxide regions 36 are on the order of 2,100 angstroms wide at their bases, which overlie and contact gate oxide 20.

This anisotropic etch process removes oxide but is selective to silicon. Consequently, this sidewall oxide formation etching step removes TEOS layer 27 plus gate oxide 20 in S/D regions 38 of transistor 10. Moreover, this sidewall oxide formation step represents a timed etch. The timing is adjusted so that a significant portion of silicide barrier 28 remains over gate 30. In the preferred embodiment, silicide barrier 28 may advantageously be less than a thousand angstroms thick at this point. Such a thickness for silicide barrier 28 is thick enough to prevent a silicide from forming on gate 30 during a subsequent silicide formation process, but is thin enough to be removed in a later-occurring step without sacrificing an undesirably large quantity of field oxide regions 18.

After the formation of sidewall oxides 36, the present process deposits a dummy TEOS oxide layer 40 using conventional LPCVD deposition techniques over the entirety of transistor 10. In the preferred embodiment, TEOS oxide layer 40 is on the order of 300 angstroms or less in thickness. Oxide layer 40 protects substrate surface 14 from potentially harmful effects of an implantation step, which occurs next. This implantation step implants either N or P type dopant through oxide layer 40 into substrate 12 at surface 14. The polarity of dopant used in this implantation step is the same as the polarity used in the implantation step discussed above in connection with FIG. 3, and is dependent upon the polarity of transistor 10. However, this implantation step provides the dopant which forms the basic source and drain (S/D) regions for transistor 10. Therefore this implantation step introduces dopant at a greater dosage level than is used in the lightly doped drain implantation step, discussed above. After this implantation, an annealing step drives in the dopant. S/D regions 42 result.

Figure 5:
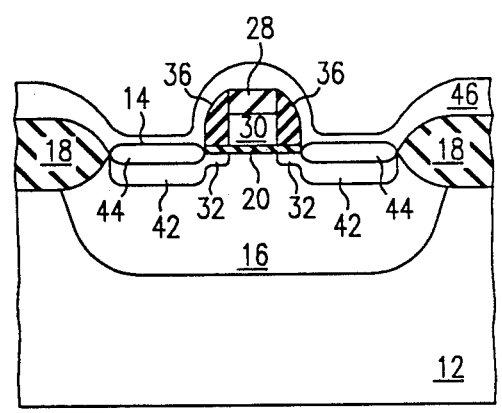
FIG. 5 shows a schematic, cross-sectional side view of the present invention at a fifth stage of fabrication.

FIG. 5 shows a schematic, cross-sectional side view of transistor 10 at a fifth stage of fabrication. The structure shown in FIG. 5 results from applying a refractory metal layer to the structure shown in FIG. 4 and then annealing transistor 10 in an environment containing a significant quantity of nitrogen. Specifically, the present process first removes dummy oxide layer 40 (see FIG. 4) using a conventional anisotropic etching process. This anisotropic etching process may sacrifice a small quantity of field oxide regions 18, silicide barrier 28, and sidewall oxides 36 without causing detrimental effects. Next, the refractory metal layer (not shown) is sputter deposited overlying the entirety of transistor 10. In the preferred embodiment, titanium (Ti) (not shown) is deposited to a thickness on the order of a thousand angstroms or less. Next, transistor 10 is heated in a nitrogen ($N_2$) atmosphere to expedite a chemical reaction between the nitrogen atmosphere and the Ti, and between the Ti and the silicon (Si) of substrate 12 at S/D regions 42. As shown in FIG. 5, the chemical reaction between the Ti and Si form titanium disilicide (TiSi$_2$) 44. Moreover, substantially all of the remaining Ti reacts with the N$_2$ atmosphere to form titanium nitride (TiN) 46. In the preferred embodiment, the heating of transistor 10 occurs at around 675° C. for around 30 minutes, and produces silicide 44 at a thickness of around 2,000 angstroms. In addition, TiN layer 46 overlies silicide 44 to a thickness of around 300 angstroms. As shown in FIG. 5, silicide 44 is spaced away from gate 30 by the width of sidewall oxides 36. During the reacting of Ti to form TiN layer 46 and silicide layer 44, silicide barrier 28 over gate 30 prohibits the formation of silicide on gate 30. Thus, only TiN layer 46 exists over silicide barrier 28.

Figure 6:
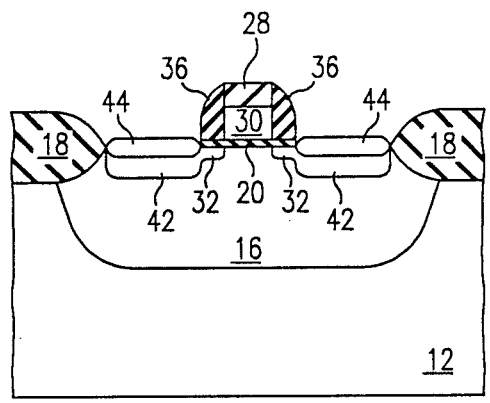
FIG. 6 shows a schematic, cross-sectional side view of the present invention at a sixth stage of fabrication.

FIG. 6 shows a schematic, cross-sectional side view of transistor 10 at a sixth stage of fabrication. The structure shown in FIG. 6 results from removing TiN layer 46 from the structure shown in FIG. 5. This removal occurs through a conventional selective chemical etch which removes the TiN without substantially removing silicide layer 44 or oxide sections 18, 28, and 36. Consequently, silicide 44 remains over S/D regions 42 of transistor 10, and silicide barrier 28 remains over gate 30 of transistor 10.

The present invention contemplates alternative processes for the formation of silicide 44. For example, the present invention may employ an oxide-capped process or a nitride-capped process wherein an oxide layer or a nitride layer (not shown) is deposited over the Ti before transistor 10 is heated to form silicide layer 44. The Ti is next reacted with the Si in substrate 12 by heating. In these oxide-capped or nitride-capped processes, the outermost oxide layer prevents the formation of TiN layer 46, discussed above in connection with FIG. 5. However, subsequent to the formation of silicide layer 44 in these oxide-capped or nitride-capped processes, the oxide layer or nitride layer and the unreacted Ti layer are removed and the resulting structure is substantially as shown in FIG. 6. In addition, transistor 10 at the sixth stage of fabrication may be annealed at, for example, 700° C. for 30 minutes to reduce the sheet resistivity of silicide layer 44.

Figure 7:
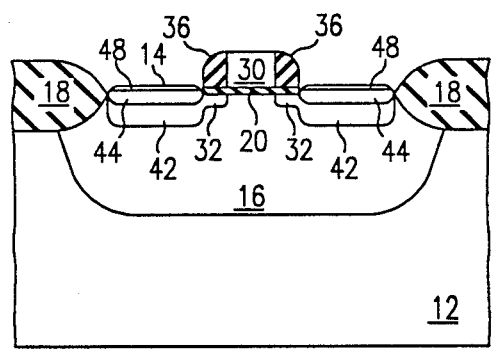
FIG. 7 shows a schematic, cross-sectional side view of the present invention at a seventh stage of fabrication.

FIG. 7 shows a schematic, cross-sectional side view of transistor 10 at a seventh stage of fabrication. The structure shown in FIG. 7 results from removing silicide barrier 28 from over gate 30 and forming a silicide barrier 48 over silicide layer 44. The removal of silicide barrier 28 occurs through the use of a selective chemical etching step which etches oxides at a significantly faster rate than it etches either silicide layer 44 or silicide barrier 48. The formation of silicide barrier 48 occurs by annealing transistor 10 in an atmosphere which contains a substantial amount of nitrogen. In the preferred embodiment, this annealing step occurs at a temperature of around 700° C. or more. The nitrogen gas at this temperature reacts with the TiSi$_2$ to form either TiN or a TiN/TiSi$_2$ composite. In the preferred embodiment, silicide barrier 48 is around 300 angstroms thick, and silicide layer 44 is around 1,700 angstroms thick after the formation of silicide barrier 48.

The two steps of forming silicide barrier 48 and removing silicide barrier 28 (see FIG. 6) are largely interchangeable. However, one step may be performed before the other depending upon the availability of chemical etchants which etch oxide but are more selective to either of TiN or TiSi$_2$ than the other. The etching of silicide barrier 28 additionally removes a portion of sidewall oxides 36 and field oxide regions 18. However, no detrimental impact occurs from this sacrifice.

Figure 8:
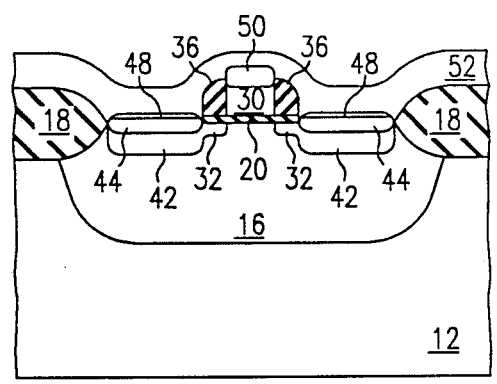
FIG. 8 shows a schematic, cross-sectional side view of the present invention at an eighth stage of fabrication.

FIG. 8 shows a schematic, cross-sectional side view of transistor 10 at an eighth stage of fabrication. The structure shown in FIG. 8 results from sputter depositing a refractory metal (not shown), such as titanium, over the entirety of transistor 10, and reacting the metal with the silicon of gate 30 and with a nitrogen atmosphere to form silicide 50 and a metal-nitride layer 52. Specifically, the preferred embodiment of the present invention deposits Ti to a thickness on the order of 1,500 angstroms. The thickness of Ti used at this step in the process of the present invention may advantageously be greater than the thickness of Ti used in the process step described above in connection with FIG. 5 so that sheet resistance of gate 30 may be decreased without increasing the junction depth of S/D regions 42.

The silicide formation process used to form silicide 50 is similar to the silicide formation process discussed above in connection with FIG. 5. Thus, transistor 10 may be heated to a temperature of around 675° C. for around 30 minutes or longer until substantially no unreacted Ti remains. Alternatively, an oxide or nitride-capped process may be utilized to form silicide 50, and additional annealing may occur to reduce the sheet resistivity of silicide 50 or silicide 50 and silicide 44. Since silicide barrier 48 resides between silicide 44 and the Ti, additional silicide is not formed at silicide 44, and silicide 44 is prevented from expanding in thickness and consuming additional portions of S/D regions 42. In the preferred embodiment, silicide layer 50 achieves a thickness on the order of 3,000 angstroms.

Figure 9:
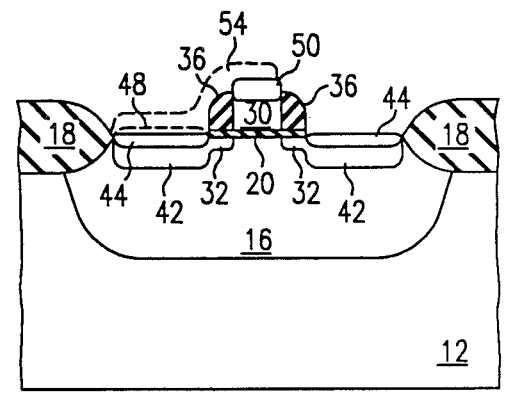
FIG. 9 shows a schematic, cross-sectional side view of the present invention at a ninth stage of fabrication.

FIG. 9 shows a schematic, cross-sectional side view of transistor 10 at a ninth stage of fabrication. The structure shown in FIG. 9 results from removal of TiN layers 48 and 52 from the structure shown in FIG. 8. Such removal may advantageously occur through the use of selective chemical etchants so that no significant portions of silicides 44 or oxides 36 and 18 are simultaneously removed. However, the present invention contemplates the potential use of a patterning step in connection with the etching of layers 52 and 48. Such patterning may selectively remove layers 52 and 48 so that a local interconnect 54 remains, as shown enclosed within dotted lines in FIG. 9. Since TiN is a conductor, local interconnect 54 may provide electrical connection between gate 30 and at least one of S/D regions 42 of transistor 10. Regardless of whether local interconnect 54 is formed in connection with the removal of layers 48 and 52, silicide layers 50 and 44 remain, and the thickness of silicide layer 44 need not equal the thickness of silicide layer 50, and may advantageously be less than the thickness of silicide layer 50.

Conventional, subsequent processing steps may apply a TEOS layer (not shown) overlying the entirety of transistor 10, apply a phosphor silicate glass layer (not shown) overlying the TEOS layer, and form holes through the TEOS and glass layers for contacts to silicides 50 and 44 over gate 30 and S/D regions 42, respectively. Next, a metallization step may occur followed by a patterning and etching step. Finally, finishing passivation layers (not shown) may be applied to transistor 10 to complete the integrated circuit fabrication.

In summary, the present invention provides a MOS transistor fabrication process in which the thickness of silicide 50 over gate 30 may differ from the thickness of silicide 44 over S/D regions 42. Moreover, the present invention does not require the etching of nitride or metal layers in connection with the etching step described above in FIG. 2 that forms gate 30. Consequently, desirably straight, vertical sidewalls on gate 30 result. Still further, the present invention refrains from including thermal oxidation cycles after the formation of gate oxide 20 so that the geometry of gate oxide 20 underlying gate 30 is not distorted.

The present invention has been described above with reference to preferred embodiments. However, those skilled in the art will recognize that changes and modifications may be made in these preferred embodiments without departing from the scope of the present invention. For example, it is anticipated that gases other than nitrogen, such as ammonia, may be used in the formation of silicide barrier layer 48, as discussed above in connection with FIG. 7. Any gas is acceptable so long as it reacts with silicide to form a barrier that prevents expansion of silicide layer 44 in the subsequent silicide formation step which forms silicide 50 (see FIG. 8). In addition, those skilled in the art will recognize that other metals may be utilized besides the titanium discussed above. Still further, those skilled in the art will recognize that the various dimensions discussed herein are particularly subject to modification, especially as semiconductor device geometries shrink. These and other changes and modifications which are obvious to those skilled in the art are intended to be included within the scope of the present invention.

What is claimed is:

1. A method of manufacturing a semiconductor device in a silicon substrate having semiconducting surface areas thereon, said method comprising the steps of:
   forming a silicon gate region overlying a portion of one of said surface areas;
   forming a first silicide barrier layer overlying said gate region;
   forming a first silicide layer in said substrate at said one surface area along a side of said gate region, said first silicide barrier layer preventing silicide from forming on said gate region;
   forming a second silicide barrier layer overlying said first silicide layer, said second silicide barrier layer substantially preventing said first silicide layer from expanding; and
   forming a second silicide layer on said gate region with said second silicide barrier layer in place.

2. A method as claimed in claim 1 additionally comprising the step of dimensioning the thickness of said first silicide layer to be different from the thickness of said second silicide layer.

3. A method as claimed in claim 2 additionally comprising the step of selecting the thickness of said first silicide layer to be less than the thickness of said second silicide layer.

4. A method as claimed in claim 1 additionally comprising the step of forming a sidewall oxide on sides of said gate region so that said first silicide layer is spaced laterally away from said gate region in said forming a first silicide layer step.

5. A method as claimed in claim 1 wherein said forming a first silicide barrier layer step comprises the step of depositing an oxide layer for formation of said first barrier layer therefrom.

6. A method as claimed in claim 1 additionally comprising the step of removing said first silicide barrier layer prior to said forming a second silicide layer step so that said second silicide layer may be formed on said gate region.

7. A method as claimed in claim 6 wherein said removing step comprises the step of etching said first silicon barrier layer using a chemical etchant which etches said first barrier layer faster than it etches one of said second silicide barrier layer and said first silicide.

8. A method as claimed in claim 1 wherein said forming a first silicide layer step comprises the steps of:
   depositing a metal layer over said one area;
   heating said semiconductor device to expedite a chemical reaction with said silicon substrate; and
   removing portions of said metal layer not reacting with said silicon substrate during said heating step.

9. A method as claimed in claim 8 wherein said depositing step deposits Ti, said heating step heats said semiconductor device in an environment having a substantial quantity of nitrogen, and said removing step removes TiN.

10. A method as claimed in claim 1 wherein said forming a silicide barrier layer step comprises the step of heating said semiconductor device in an environment having a substantial quantity of nitrogen so that said nitrogen reacts with said first silicide layer to form said barrier layer.

11. A method as claimed in claim 10 additionally comprising the step of depositing a Ti layer on said semiconductor device so that said forming a first silicide layer step forms TiSi$_2$ and so that said heating step causes said barrier layer to be formed substantially of TiN.

12. A method as claimed in claim 1 wherein said forming a second silicide layer step comprises the steps of:
   depositing a metal layer overlying said one area;
   heating said semiconductor device to expedite a chemical reaction with said silicon gate region; and
   removing portions of said metal layer not reacting with said silicon gate region during said heating step.

13. A method of manufacturing a semiconductor device in a substrate having a silicon surface area thereon, said method comprising the steps of:
   forming a polycrystalline silicon gate overlying a portion of said silicon surface area;
   forming a first silicide barrier layer overlying said gate, said first silicide barrier layer preventing the formation of silicide on said gate;
   forming a first silicide layer at said surface area of said substrate on opposing sides of said gate;
   removing said first silicide barrier layer;
   forming a second silicide barrier layer overlying said first silicide layer, said second silicide barrier layer being for preventing said first silicide layer from expanding; and
   forming a second silicide layer overlying said gate.

14. A method as claimed in claim 13 wherein said forming a first silicide barrier layer step comprises the step of depositing an oxide layer overlying and in contact with said gate.

15. A method as claimed in claim 13 additionally comprising the step of dimensioning the thickness of said first silicide layer to be less than the thickness of said second silicide layer.

16. A method as claimed in claim 13 wherein said forming a second silicide barrier layer step comprises the step of heating said semiconductor device in an environment having a substantial quantity of nitrogen so that said nitrogen reacts with said first silicide layer to form said second barrier layer.

17. A method as claimed in claim 12, further comprising:

patterning said metal layer not reacting with said silicon gate region during said heating step, so that a portion thereof remains after said removing step to form an interconnection.

18. A method as claimed in claim 17, wherein said interconnection connects said first silicide to said second silicide.

* * * * *